United States Patent [19]

Karnett

[11] Patent Number: 4,818,335

[45] Date of Patent: Apr. 4, 1989

[54] TAPERED WET ETCHING OF CONTACTS USING A TRILAYER SILOX STRUCTURE

[75] Inventor: Martin P. Karnett, Catonsville, Md.

[73] Assignee: The United States of America as represented by the Director of the National Security Agency, Fort George G. Meade, Md.

[21] Appl. No.: 197,007

[22] Filed: May 13, 1988

[51] Int. Cl.⁴ .................. B44C 1/22; C03C 15/00; C03C 25/01; H01L 21/306

[52] U.S. Cl. .................. 156/644; 156/653; 156/657; 156/659.1; 156/663; 357/23.1; 357/65; 437/43; 437/180; 437/238; 437/240

[58] Field of Search ............ 156/644, 653, 657, 659.1, 156/662, 663; 437/57, 43, 56, 58, 180, 186, 187, 191, 192, 203, 228, 238, 240; 357/23.1, 23.5, 23.6, 41, 42, 43, 44, 65

[56] References Cited

U.S. PATENT DOCUMENTS

| | | | |
|---|---|---|---|
| 3,880,684 | 4/1975 | Abe | 156/8 |
| 4,337,115 | 6/1982 | Ikeda et al. | 156/659.1 |
| 4,461,672 | 7/1984 | Musser | 156/644 |
| 4,535,528 | 8/1985 | Chen et al. | 437/240 X |
| 4,634,494 | 1/1987 | Taji et al. | 156/653 X |

OTHER PUBLICATIONS

Sirken & Crabbe, "Tapering CVD SiO₂ vias for improved metal step coverage using RIE", *Electrochem. Soc. Proc.* (1983) pp. 467–474.

Saia & Gorowitz, "Dry Etching of Tapered Contact Holes Using Multilayer Resist" *J. Electrochem. Soc.*, Aug. 85, pp. 1954–1957

*Primary Examiner*—William A. Powell
*Attorney, Agent, or Firm*—John R. Utermohle; Thomas O. Maser

[57] ABSTRACT

A method for achieving tapered contact sidewalls by wet etching during fabrication of a semiconductor device is characterized by the addition of a second layer of undoped oxide to a bilayer sandwich deposited over the wafer of the device. The second layer of undoped oxide reduces the etch rate at the oxide/photoresist interface thereby providing gradual taper and improved metal step coverage. The reduced etch rate extends the utility of wet etching without changing etchant bath concentration or temperature.

9 Claims, 5 Drawing Sheets

TAPERED WET ETCHING OF CONTACTS USING A TRILAYER SILOX STRUCTURE

BACKGROUND OF THE INVENTION

As part of the standard processing of CMOS integrated circuits and semiconductor devices, it is desirable to smooth the underlying topography following gate definition to ensure smooth and continuous metal step coverage throughout the circuit. Typically, a bilayer sandwich, i.e. a top layer of phosphosilicate glass (PSG) and a bottom layer of undoped silicon dioxide, is deposited on the circuit to provide passivation, gettering, and electrical insulation between metal interconnects and underlying circuit structures. Following deposition, the PSG layer is reflowed and densified in a furnace. This smooths the surface topography to ensure continuity of the overlying metallization. The undoped oxide, which does not undergo appreciable reflow, prevents counterdoping of active device regions during high temperature processing.

Following furnace reflow, it is necessary to open windows in the oxide sandwich to permit electrical contact to the elements (i.e. source and drain regions) of each transistor of the integrated circuit. Acceptable metal step coverage throughout the windows normally requires that the contact opening etch produce sloped or tapered sidewalls. The present invention relates to an improved method for wet etching the windows in the oxide layer to achieve tapered contact sidewalls.

BRIEF DESCRIPTION OF THE PRIOR ART

Dry etching techniques such as gas (plasma) ion bombardment for opening windows in small geometries (less than three microns) are known and preferred in the art due to increased anisotropy or directionality and the ability to control sidewall profiles with instrument parameters. For example, dry etching using photoresist erosion to obtain tapered contact sidewalls has been disclosed by Crabbe and Sirkin in an article entitled "Plasma Processing" *Electrochem. Soc. Proc.*, p. 261, (1983). Multilayer resist schemes for obtaining tapered contact sidewalls are disclosed by Saia and Gorowitz, *J. Electrochem. Soc.*, vol. 132, no. 8, p. 1954–1957 (1985).

For larger geometries (greater than three microns), wet etching of contact windows is preferred owing to increased versatility, throughput, and reduced cost. Wet etching of contact windows through the oxide sandwich generally occurs in a temperature controlled, buffered HF solution (40% ammonium fluoride and 49% hydrofluoric acid in water). To achieve tapered contact sidewalls with this etchant requires that the etch rate difference between successive layers of the bilayer sandwich be minimized and that the etch rate of the oxide/photoresist interface be controlled. These requirements have been achieved in the past by diluting the etchant with ammonium fluoride and/or by increasing the temperature. The problem with this method of wet etching is that the dilution and increased temperature lead to unacceptable etch time, loss of dimensional control, and frequent solution replacement.

The present invention was developed in order to achieve tapered contact sidewalls using a wet etching process without any compromise in etchant bath concentration or temperature.

SUMMARY OF THE INVENTION

Accordingly, it is a primary object of the present invention to provide a method of producing tapered contact sidewalls in a semiconductor device having a thermally oxidized base, a first layer of undoped oxide material deposited on the thermal oxide layer of the base, and a layer of doped oxide material deposited on the undoped oxide layer, thereby defining a bilayer sandwich on the oxidized base. In accordance with the inventive method, a second layer of undoped oxide material is deposited on the layer of doped oxide material which has been reflowed and densified, following which contact windows are wet etched through the oxide layers adjacent to the source and drain regions of the base. Since the second layer of undoped oxide material has a slower etch rate than the doped layer, etching proceeds in a slower more controlled manner. The sidewalls of the contact area become more uniformly tapered to improve metal step coverage of the device while minimizing structural defects.

In accordance with a more specific object of the invention, the first and second layers of undoped oxide material comprise silicon dioxide and the layer of doped oxide material comprises phosphosilicate glass, with all of the layers of oxide material being deposited by chemical vapor deposition (CVD).

According to a further object of the invention, a layer of photoresist material is applied to the second layer of silicon dioxide. This acts as a masking material to define the contact area to be etched. Following photoresist patterning, the windows are etched in a room temperature solution of buffered hydrofluoric acid.

It is another object of the invention to deposit a layer of metal over the etched device to metallize the device and to provide for interconnections.

BRIEF DESCRIPTION OF THE FIGURES

Other objects and advantages of the invention will become apparent from a study of the following specification when viewed in the light of the accompanying drawing, in which.

DETAILED DESCRIPTION

Figure 1A:
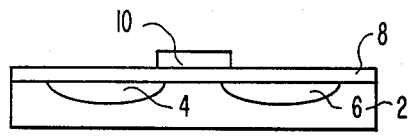
FIGS. 1a–1e are cross-sectional views illustrating the stages of fabrication of tapered contact sidewalls in a semiconductor device having a bilayer sandwich according to the prior art.
Figure 2A:
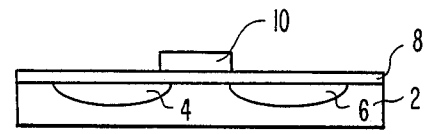
FIGS. 2a–2f are cross-sectional views illustrating the tapered wet etching of contact sidewalls using a trilayer sandwich according to the invention.

The conventional method for forming CMOS integrated circuits and semiconductor devices using a bilayer sandwich structure is shown in FIGS. 1a–1e. Referring first to FIG. 1a, a layer of base material such as a silicon wafer 2 has source 4 and drain 6 regions formed therein. The silicon wafer is preferably 2–4 ohm-cm, n-type (100) material. The wafers are thermally oxidized at 1000° C. to a thickness of 500 Å to define a gate oxide layer 8. Polysilicon is then deposited on the oxide layer 8 using low pressure chemical vapor deposition (LPCVD) to a thickness of 3.5 KÅ. The polysilicon layer is then phosphorus-doped and plasma etched to define a gate region 10 of a semiconductor device.

Figure 1B:
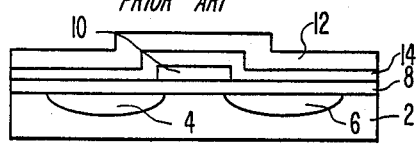

Following gate definition, a bilayer sandwich is applied as shown in FIG. 1b. More particularly, the bilayer sandwich comprises 4000 Å of phosphosilicate glass (8 wt % P) 12 over 3000 Å of undoped silicon dioxide 14 and is deposited on the device in a very low temperature oxidation (VLTO) furnace at 425° C.

Figure 1C:
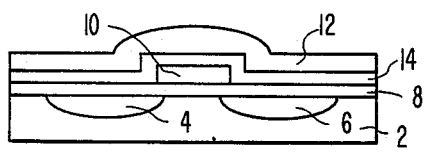

The device is then heated for ten minutes at 1000° C. in a steam ambient to reflow and densify the phosphosilicate glass (PSG) as shown in FIG. 1c.

Figure 1D:
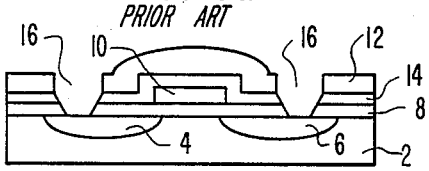
Figure 1E:
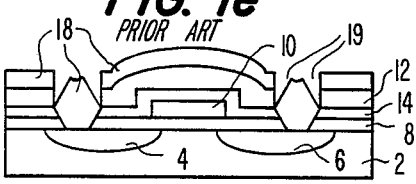

After reflow, the wafer is photolithographically treated for contact definition and etched as shown in FIG. 1d. The wafer is coated with one micron of KTI 1370 sf positive photoresist (not shown), exposed with a 1:1 projection aligner, and postbaked at 110° C. for thirty minutes in a convection oven. Windows 16 are then etched in the oxide sandwich to form the contact points on the semiconductor device. A room temperature (22° C.) solution of 10:1 buffered HF (10 parts of 40% aqueous ammonium floride solution to 1 part of 49% hydrofluoric acid by volume) is used to etch the windows. Following contact etch and removal of the photoresist layer, one micron of aluminum-silicon (1.5% Si) material 18 is deposited as shown in FIG. 1e to complete the fabrication process.

Figure 3:
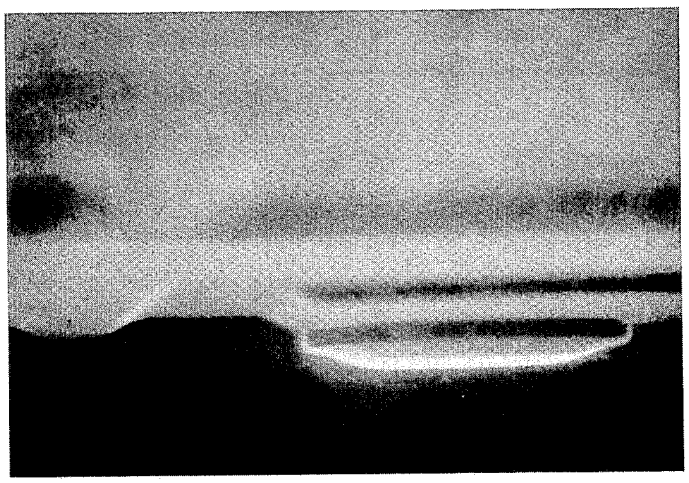
FIGS. 3 and 4 are micrographs of contact sidewall profiles for the bilayer and trilayer processes, respectively.

As will be developed below and as shown in FIG. 3, the wet etching process normally does not produce taper. Because of the speed with which the doped oxide PSG layer etches, there is essentially no taper until the undoped region 14 is reached. Moreover, cracks 19 develop in the layer of aluminum-silicon material.

Figure 2B:
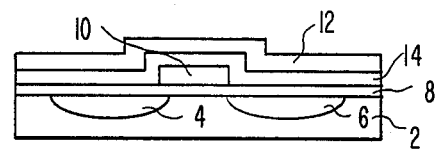
Figure 2C:
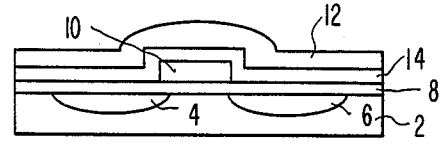

The improvement of the present invention is shown in the semiconductor fabrication process steps shown in FIGS. 2a–2f. Like the conventional process, silicon wafers 2 of 2–4 ohm-cm n-type (100) material are cleaned and oxidized 8 at 1000° C. to a thickness of 500 Å. Polysilicon is deposited using low pressure chemical vapor deposition to a thickness of 3.5 KÅ, phosphorus doped and plasma etched to define the gate region 10 of the semiconductor device. A first 3000 Å layer of undoped oxide material 14 such as silicon dioxide is deposited on the thermal oxide layer 8 and a 4000 Å layer of doped oxide material 12 such as phosphosilicate glass (8 wt % p) is deposited on the layer of undoped oxide material by chemical vapor deposition (CVD) as shown in FIG. 2b, following which the PSG is reflowed and densified for ten minutes at 1000° C. as shown in FIG. 2c.

Figure 2D:
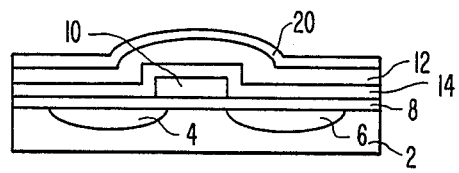

The characterizing feature of the inventive method is shown in FIG. 2d. A second layer of undoped oxide material 20 is deposited over the conventional bilayer structure by chemical vapor deposition. More particularly the second layer comprises 3000 Å of undoped silicon dioxide deposited on the phosphosilicate glass layer 12 to define a trilayer silox sandwich including the first layer of undoped oxide material 14, the layer of PSG 12, and the second layer of undoped oxide material 20.

Figure 2E:
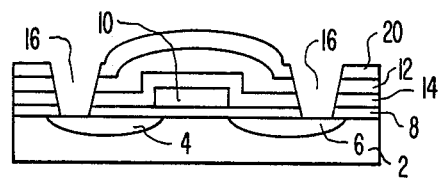
Figure 2F:
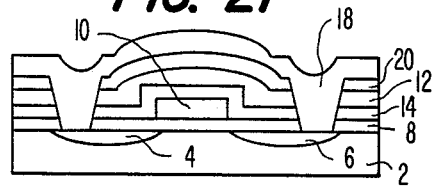

The wafer then enters photolithography for contact definition and etching in the same manner as with the conventional wafer with the bilayer sandwich. A one micron coating of KTI 1370 sf positive photoresist (not shown) is applied to the second layer of undoped oxide. The wafer is then exposed with a 1:1 projection aligner, and postbaked at 110° C. for thirty minutes in a convection oven. Windows 16 are etched in the oxide sandwich using a 22° C. solution of 10:1 buffered HF as shown in FIG. 2e. Following etching of the windows to define the contacts and stripping of the photoresist, one micron of aluminum-silicon 18 is deposited using a Varian 3118 Sputter Deposition System as shown in FIG. 2f.

The etch rates for thermal and CVD oxides in room temperature 10:1 buffered HF solution are presented in the following table:

| Layer | Oxide | Densified? | Etch Rate (Å/min) | Etch Ratio |
|---|---|---|---|---|
| A | Undoped CVD | No | 1500 | |
| B | PSG | Yes | 3000 | B:A=2.0:1 |
| C | Undoped CVD | Yes | 1400 | B:C=2.1:1 |
| D | Thermal | — | 500 | C:D=2.8:1 |
| E | PSG | No | 3500 | |

The etch rates of the various materials were measured using a Nanospec AFT 100 measuring device and have a direct bearing on the degree of contact sidewall taper achieved in the semiconductor device. The smaller the etch rate through a given layer and the lower the etch rate difference between successive layers, the more controlled the etch and the greater the degree of taper.

Figure 4:
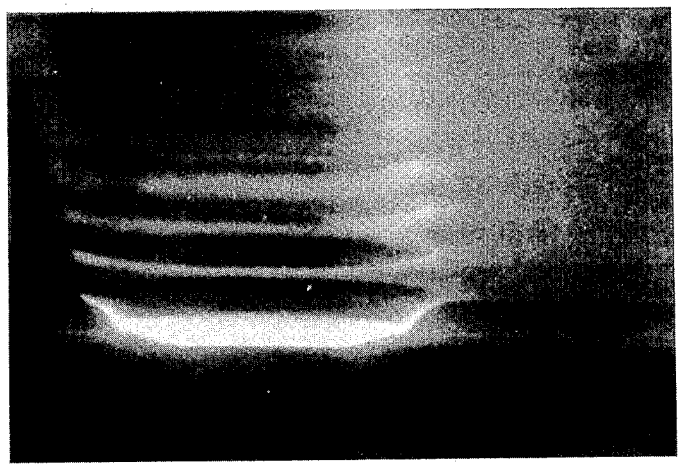

Using scanning electron microscopy, contact sidewall profiles are shown for the conventional bilayer process in FIG. 3 and for the inventive trilayer process in FIG. 4. The average etching time for the bilayer process is approximately seven minutes and for the trilayer process is approximately ten minutes. As shown in FIG. 3, nearly vertical sidewalls are formed through the PSG layer 12 with the bilayer process owing to the high etch rate at the oxide/photoresist interface and the large etch rate difference between the PSG layer and the undoped CVD oxide layer 14 beneath it. Initially, the vertical etch rate is much faster than the lateral etch rate. As the etching progresses downwardly through the undoped and thermal oxide layers 14, 8, the etch rate slows resulting in increased taper as the lateral and vertical etch rates grow closer together.

With the trilayer process, however, the contact sidewalls are well tapered, particularly at the leading edge of the contact cut as shown in FIG. 4. The application of the second CVD oxide layer 20 over the layer of PSG 12 reduces the etch rate at the oxide/photoresist interface, thereby minimizing the difference between the lateral and vertical etch rates and increasing the taper.

Figure 5:
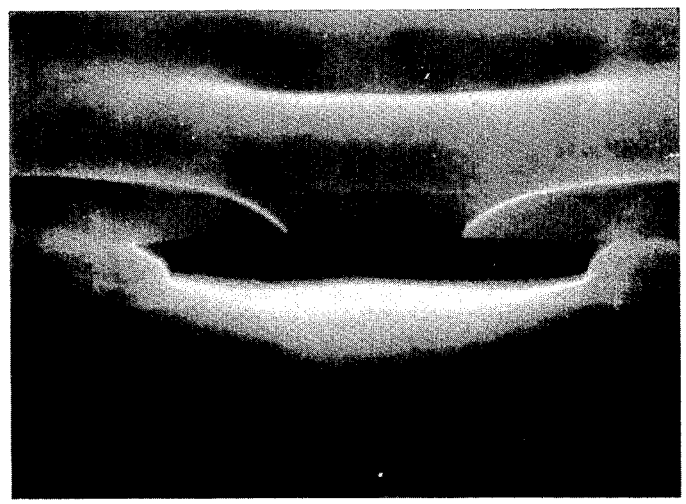
FIG. 5 is a micrograph of a contact hole with the photoresist layer intact as used in the trilayer process.

FIG. 5 is a scanning electron micrograph of a contact window with the photoresist layer intact. Although the etch time is approximately three minutes longer for the thicker, trilayer formation process according to the invention, there is little or no loss of adhesion. Thus, photoresist erosion or lifting does not appear to be responsible for the improved contact sidewall taper resulting from the wet etching of the trilayer structure.

Figure 6:
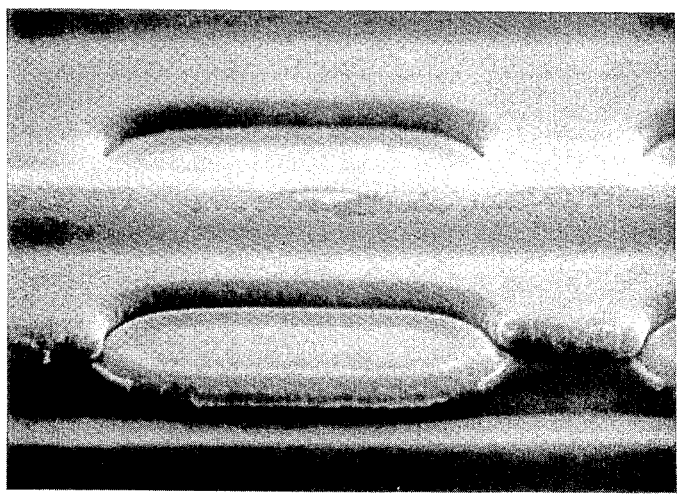
FIGS. 6 and 7 are cross-sectional micrographs of the contacts following metal deposition produced with the bilayer and trilayer processes, respectively.
Figure 7:
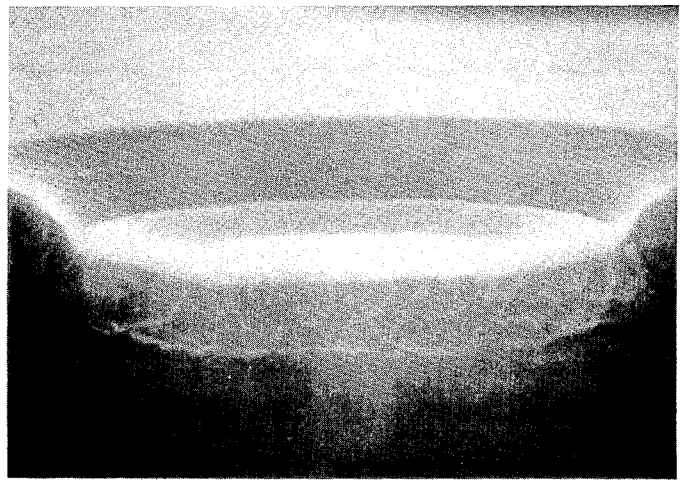
Figure 8:
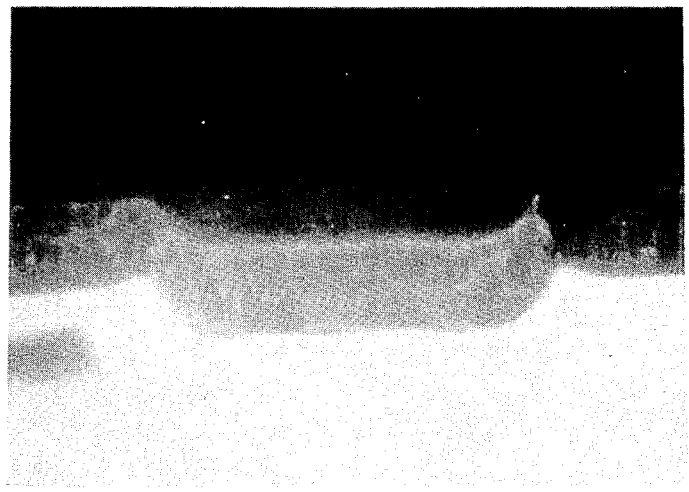
FIGS. 8 and 9 are cross-sectional micrographs depicting metal step coverage over polysilicon gates for the bilayer and trilayer processes, respectively.
Figure 9:
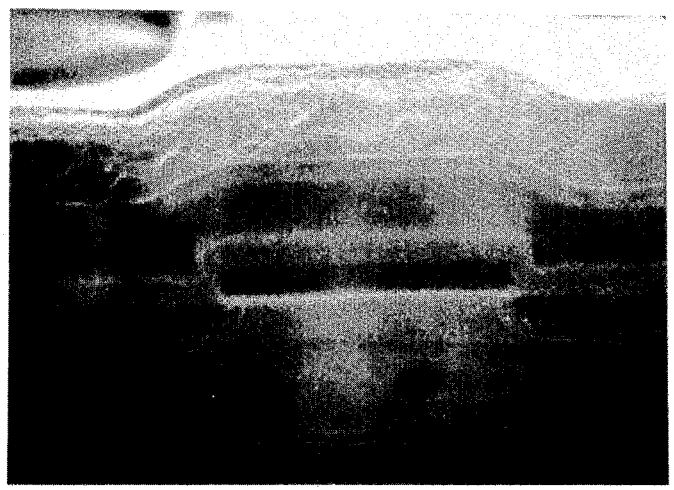

The scanning electron micrographs of FIGS. 6 and 7 are cross-sections of the contacts following metal deposition of the bilayer and trilayer structures, respectively. FIGS. 8 and 9 are micrographs of cross-sections depicting metal step coverage over polysilicon gates for the bilayer and trilayer structures, respectively. As shown therein, the vertical sidewalls through the PSG layer of the conventional bilayer process severely disrupts metal step coverage, while the tapered sidewalls achieved with the trilayer wet etching process lead to substantial improvements in metal step coverage throughout the contact cuts. Furthermore, the undoped CVD oxide overcoat or second layer used in the trilayer process conforms with the smooth PSG surface beneath it, thereby maintaining good metal step coverage over polysilicon gates.

A gradual taper of contact sidewalls is valuable because it improves the likelihood that structure defects or breakage will not occur during the metallization process or during device operation, thus improving device reliability. A steep or vertical taper increases the likelihood of breakage. With the improved semiconductor fabrication process of the invention, a gradual taper is achieved with wet etching by slowing the initial etch just below the photoresist layer. This is accomplished by applying a second undensified CVD oxide layer on the PSG layer of a conventional bilayer sandwich following reflow and densification. With the addition of this CMOS processing step, the utility of wet etching is extended without any compromise in etchant bath concentration or temperature.

While in accordance with the provisions of the patent statute the preferred forms and embodiments of the invention have been illustrated and described, it will be apprarent to those of ordinary skill in the art that various changes or modifications may be made without deviating from the inventive concepts set forth above.

What is claimed is:

1. A method for producing tapered contact sidewalls in a semiconductor device including a thermally oxidized base having gate, source and drain regions, a first layer of undoped oxide material deposited on the thermal oxide layer of the base and a layer of doped oxide material deposited on the layer undoped oxide material, comprising the steps of:
   (a) depositing a second layer of undoped oxide material on the layer of doped oxide material; and
   (b) wet etching windows in the oxide layers adjacent to the source and drain regions to define contact areas of the device, said second layer of undoped oxide material having a slower etch rate than said layers of doped and thermal oxide material, whereby the sidewalls of the contact areas are uniformly tapered to improve metal step coverage of the device while minimizing structural defects and increasing long term device reliablity.

2. A method as defined in claim 1, wherein said first and second layers of undoped oxide material comprise silicon dioxide.

3. A method as defined in claim 2, wherein said layer of doped oxide material comprises phosphosilicate glass.

4. A method as defined in claim 3, wherein said layers of oxide material are deposited by chemical vapor deposition.

5. A method as defined in claim 4, and further comprising the step of photolithographically treating the device prior to said etching step.

6. A method as defined in claim 5, wherein a layer of photoresist material is applied to said second layer of undoped silicon dioxide, following which the device is heated.

7. A method as defined in claim 6, wherein said oxide layers are etched with a solution of 10:1 buffered hydrofluoric acid.

8. A method as defined in claim 7, wherein said layer of phosphosilicate glass is reflowed and densified prior to deposition of said second layer of undoped silicon dioxide.

9. A method as defined in claim 8, and further comprising the step of depositing a layer of metal over the etched windows.

* * * * *